US 7,495,668 B2

(12) United States Patent
Shioda et al.

(10) Patent No.: US 7,495,668 B2
(45) Date of Patent: Feb. 24, 2009

(54) DISPLAY CONTROLLER WITH DISPLAY MEMORY CIRCUIT

(75) Inventors: Junyou Shioda, Kanagawa (JP); Takashi Nose, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 420 days.

(21) Appl. No.: 11/000,174

(22) Filed: Dec. 1, 2004

(65) Prior Publication Data

US 2005/0116960 A1 Jun. 2, 2005

(30) Foreign Application Priority Data

Dec. 1, 2003 (JP) ............... 2003-401392

(51) Int. Cl.
*G09G 5/39* (2006.01)
*G06F 13/372* (2006.01)
*G06F 13/00* (2006.01)

(52) U.S. Cl. ............... 345/531; 345/534; 345/536

(58) Field of Classification Search ............... 345/531, 345/536, 534
See application file for complete search history.

(56) References Cited

U.S. PATENT DOCUMENTS 5,818,434 A * 10/1998 Yamamoto et al. .......... 345/565
2002/0075272 A1 * 6/2002 Tani et al. ............... 345/531

FOREIGN PATENT DOCUMENTS

JP    8-161890      6/1996
JP    2000-250733   9/2000

* cited by examiner

*Primary Examiner*—Kee M Tung
*Assistant Examiner*—Jacinta Crawford
(74) *Attorney, Agent, or Firm*—Young & Thompson (57) ABSTRACT

A display memory circuit includes a drawing memory and a dynamic display memory. The drawing memory stores data and at least a portion of the data are possibly rewritten into a new data at a third timing, the third timing being optional between a first timing and a second timing. The dynamic display memory is connected with the drawing memory, which latches the data in response to the first timing and continues to hold the data between the first timing and the second timing. The drawing memory is partially disconnected from the dynamic display memory in the rewritten portion when the portion is rewritten in the drawing memory.

13 Claims, 8 Drawing Sheets

DISPLAY CONTROLLER WITH DISPLAY MEMORY CIRCUIT

BACKGROUND OF THE INVENTION

1. Field of the Invention

The present invention relates to a display controller with a display memory circuit, and more particularly to a display controller with a display memory circuit in which a multi-port memory is used.

2. Description of the Related Art

A conventional display memory circuit is widely used for a display controller or a display system to control a display apparatus to display an image. For instance, in case of a matrix type display apparatus such as a liquid crystal display apparatus, the circuit of a display controller is integrated and installed adjacent to a display panel of the display apparatus. The display controller drives H data lines arranged in parallel to a vertical direction of the display panel directly.

Figure 1:
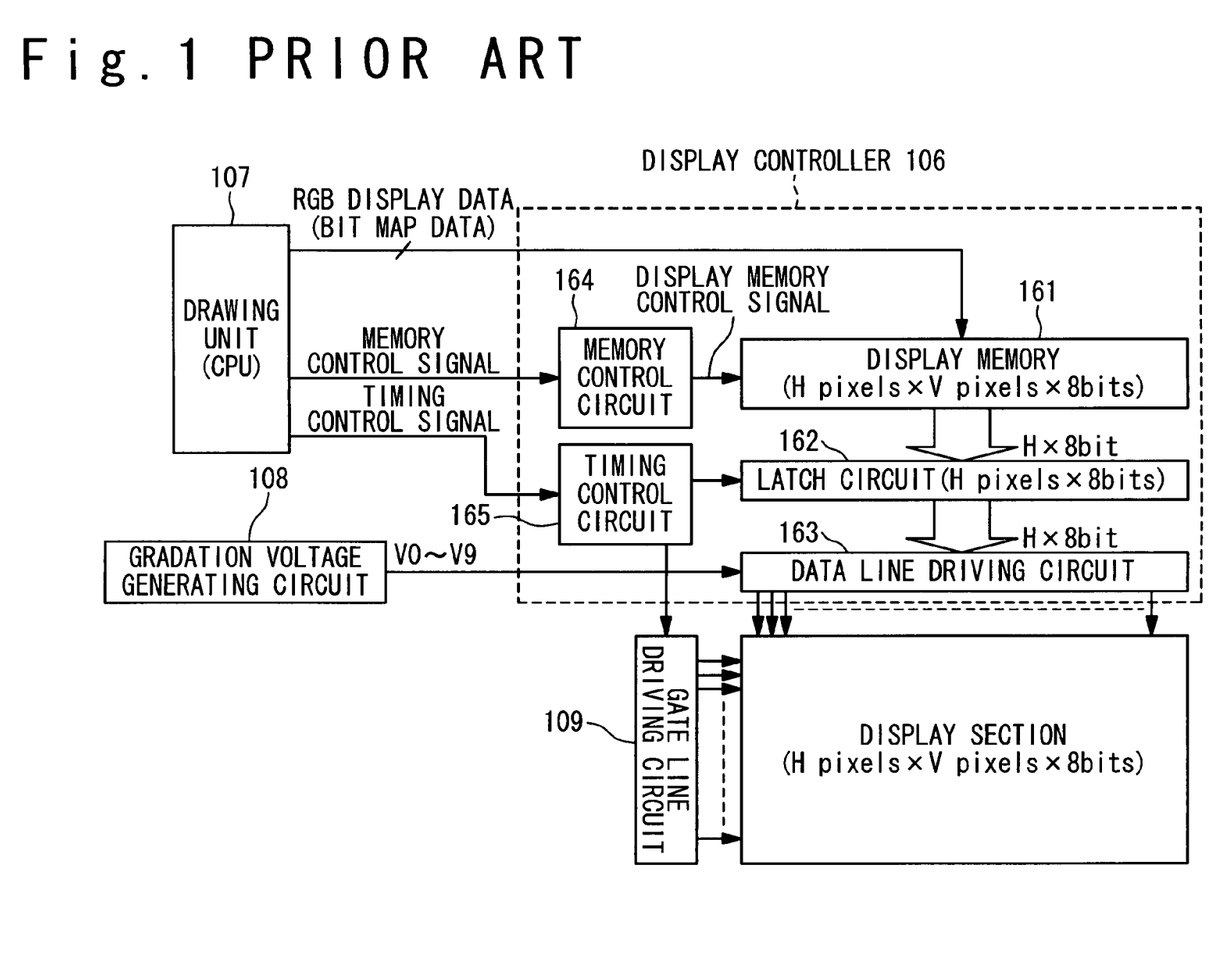
FIG. 1 is a block diagram showing a first conventional display controller and a peripheral circuit of the display controller.

FIG. 1 is a block diagram showing a conventional display controller and a peripheral circuit of the display controller. The display controller 106 includes a display memory 161, a latch circuit 162, a data line driving circuit 163, a memory control circuit 164 and a timing control circuit 165. Here, a drawing unit 107 carries out a drawing process, and a gradation voltage generating circuit 108 generates gradation voltages V0 to V9. Also, a gate line driving circuit 109 selects and drives V gate lines arranged in parallel to the horizontal direction of the display panel in accordance with scanning of the display frame. A display section has the size of H pixels×V pixels×8 bits.

The display memory 161 is a 2-port memory with an external port and a read port only for a reading operation and is configured as a display memory circuit in the display controller. The display memory 161 is accessed by the drawing unit 107 through the external port. The display memory 161 receives and stored therein RGB display data of H pixels×V pixels×8 bits for one frame transferred from the drawing unit 107. Then, the display memory 161 sequentially select read word lines or horizontal lines in response to the scanning of the display frame and outputs the RGB display data in units of H pixels×8 bits from the read port to the latch circuit 162.

Figure 2:
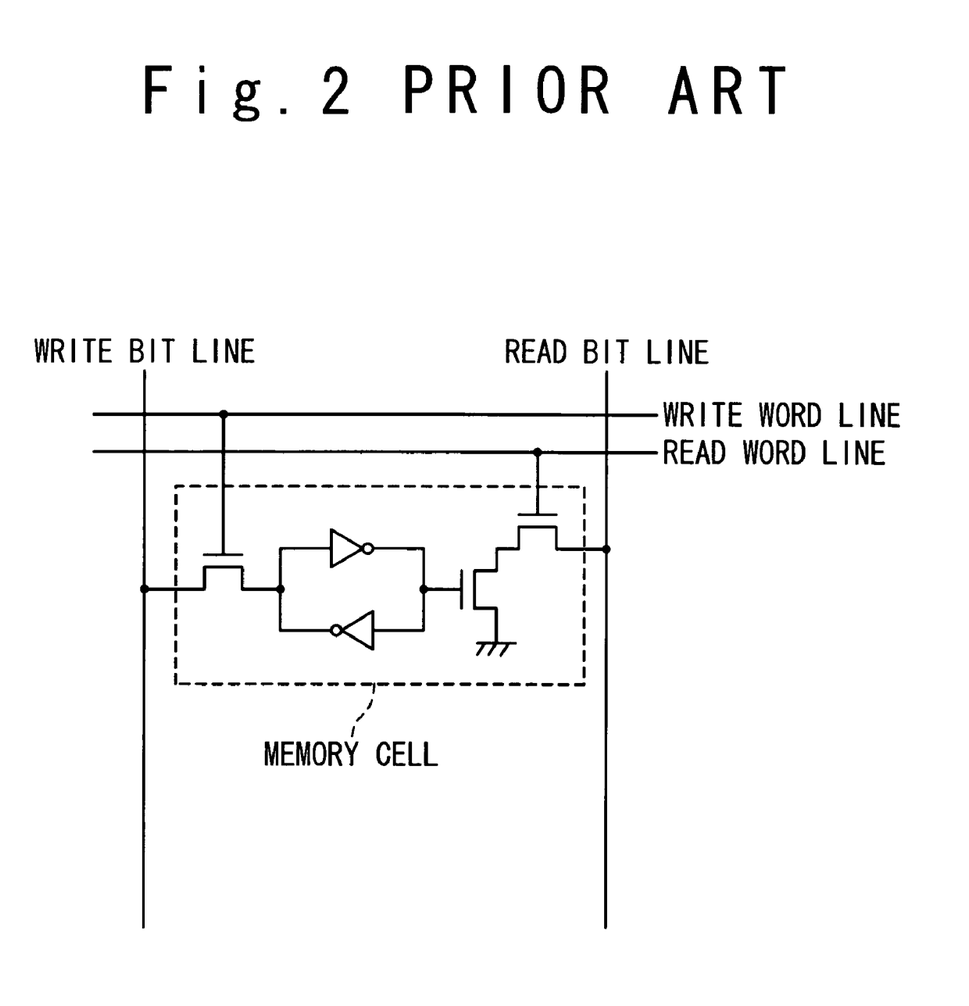
FIG. 2 is a circuit diagram showing a memory cell in the first conventional display controller.

FIG. 2 is a circuit diagram showing the simplest example of the memory cell of this conventional multi-port memory shown in Japanese Laid Open Patent Application (JP-A-Heisei 8-161890). A memory cell of the multi-port memory is connected with a write bit line and a read bit line, and is selected by a write word line and a read word line. The memory cell is asynchronously accessed through the read port and a write port as the external port.

The latch circuit 162 latches the RGB display data of H pixels×8 bits, which have been read out from the read port of the display memory 161, in synchronism with a display clock, and then outputs the latched data to the data line driving circuit 63.

The gradation voltage generating circuit 8 generates 64 gradation voltages expressed by gradation voltages V0 to V9. The data line driving circuit 163 converts the RGB display data into analog signals by selecting one of 64 gradation voltages for one pixel based on the RGB display data of H pixels×8 bits outputted from the latch circuit 162. Then, the data line driving circuit 163 drives the H data lines in the display section in parallel. The V lines are sequentially driven by the gate line driving circuit 109.

The memory control circuit 164 inputs the memory control signal including an address signal from the drawing unit 107 to control the writing operation into the display memory 61 by the drawing unit 107. Also, the memory control circuit 164 inputs a synchronization signal and a display clock signal of the display frame from the timing control circuit 165 to control the reading operation from the display memory 161.

The timing control circuit 165 inputs the timing control signal from the drawing unit 107 and generates the synchronization signal and the display clock signal of the display frame to output the latch circuit 162, the memory control circuit 164 and the gate line driving circuit. 109. Thus, the timing control circuit 165 carries out a timing control of the scanning of the display frame.

This conventional display controller 106 stops the transfer of image data from an external unit, and drives the display section based on the RGB display data already stored in the display memory 161, when the display image is not dynamically changed like a still image. On contrary, when the display image is a video image, only the RGB display data of a changed portion of the display image is transferred. Thus, a reduction in power consumption is achieved.

Figure 3:
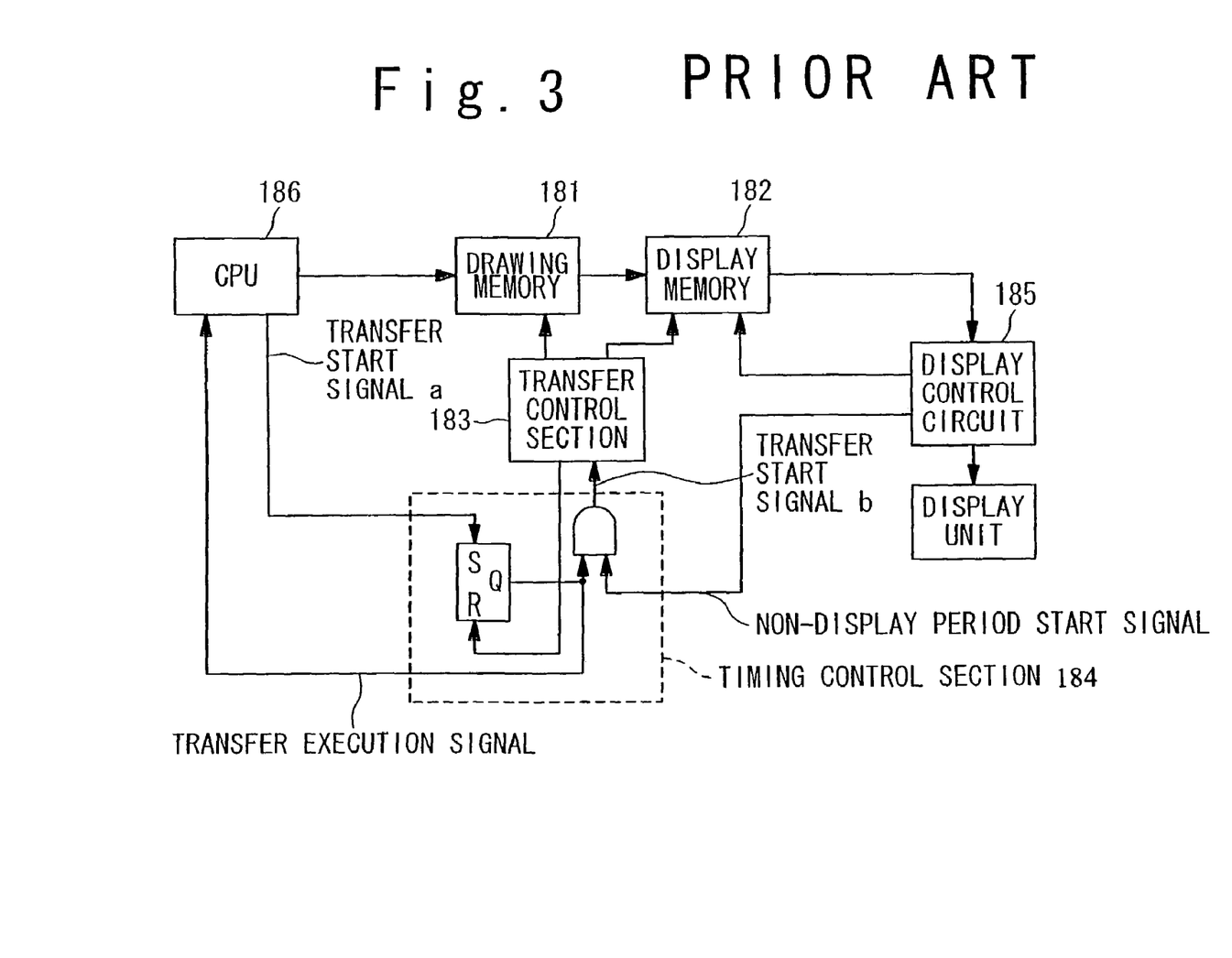
FIG. 3 is a block diagram showing a second conventional display system.

Next, FIG. 3 is a block diagram showing another example of a conventional display system shown in Japanese Laid Open Patent Application (JP-P2000-250733A). The conventional display system includes a drawing memory 181, a display memory 182, a transfer control section 183, a timing control section 184, a display control circuit 185, and a CPU 186. Here, the functions of the display memory 182 and the display control circuit 185 correspond to the function of the display controller 106 shown in FIG. 1. The drawing memory 181 and the display memory 182 are used as a display memory circuit in the display system.

The drawing memory 181 is a work memory for the CPU 186 to store an image data. The display memory 182 stores an image data for the CPU 186 as a display data, like the display memory 161 shown in FIG. 1.

The transfer control section 183 starts the control of the transfer of the image data from the drawing memory 181 to the display memory 182 in response to a transfer start signal b and outputs a transfer end signal to the timing control section 184. The timing control section 184 outputs the transfer start signal b to the transfer control section 183 in response to a transfer start signal a from the CPU 186 and a non-display period start signal after the transfer start signal is made valid. Then, the timing control section 184 outputs a transfer execution signal to the CPU 16 until the transfer end signal is inputted.

The display control circuit 185 reads out the RGB display data from the display memory 182 in a constant period to transfer the data to the display section, and outputs the non-display period start signal to the timing control section 184. The CPU 186 carries out the drawing processing. After writing operation into the drawing memory 181, the CPU 186 outputs the transfer start signal a to the timing control section 184.

In this display system, the display control circuit 185 reads out the display data from the display memory 182 in a constant period, and carries out D/A conversion to the read out display data to transfer the data to the display section. The period that the display data for one frame is transferred to the display section is a display period. The non-display period is usually very shorter than the display period. When the CPU 186 changes the display data, the CPU 186 writes a new drawing data in the drawing memory 181. In this initial state, the CPU 186 and the display control circuit 185 can asynchronously access the drawing memory 181 and the display memory 182, respectively, because the transfer control section 183 is not operating. After the writing operation of the drawing data into the drawing memory 181, the CPU 186 outputs the transfer start signal a to the timing control section 184. After confirming invalidation of the transfer execution signal, the CPU 186 writes the next drawing data in the drawing memory 181 to update the stored data to the next drawing data.

Next, when the CPU 186 outputs the transfer start signal a to the timing control section 184, the timing control section 184 outputs the transfer execution signal to the CPU 186, and the transfer start signal b to the transfer control section 183 in response to the non-display period start signal. The transfer control section 183 transfers the drawing data from the drawing memory 181 to the display memory 182 in response to the transfer start signal b. This period is the non-display period in which the drawing memory 181 and the display memory 182 are not accessed by the CPU 186 and the display control circuit 185. As a result, it is possible to carry out the above transfer normally. When the transfer is completed, the transfer end signal is outputted from the transfer control section 183 to the timing control section, and the transfer execution signal is made invalid by the timing control section 184. In the next display period, the updated display data of the display memory 182 is read out by the display control circuit 185 and is outputted to the display section. Therefore, the display data on the updating operation is never displayed, and the updated display data in units of frames is displayed. Thus, the display screen never fall into disorder.

In this way, in recent years, in the display controller of a portable equipment, high precision display and a multi-function such as a video image reproduction are progressing based on user demand. It is possible to accomplish the high precision display by increasing the capacity of a display memory. Also, it is possible to accomplish the multi-function by adding a drawing circuit or a CPU and the drawing memory to the display controller and by transferring the data from the drawing memory to the display memory during the non-display period, like the display system shown with FIG. 3.

However, in this case, the display memory needs a memory capacity to store the RGB display data for at least one frame in order to reduce consumption power during the data transfer. Also, the drawing memory also needs a memory capacity to store the drawing data for one frame. Therefore, the memory capacity of the display memory circuit becomes large, resulting in increase of the circuit scale of the display controller.

Also, a data transfer quantity from the drawing memory to the display memory increases and the consumption power increases. Especially, since the data are transferred in units of frames between the display controller and the drawing apparatus, the data transfer quantity increases, resulting in increase of the consumption power. As a result, the battery duration of the portable equipment becomes short.

Also, in the display system shown in FIG. 3 and containing the drawing memory and the display memory, the similar problems such as the increase of the circuit scale and the increase of consumption power are caused.

SUMMARY OF THE INVENTION

Therefore, an object of the present invention is to provide a display controller with a display memory circuit in which the increase of a circuit scale and the increase of consumption power are suppressed regardless of the high precision display and the multi-function achievement.

In an aspect of the present invention, a display memory circuit includes a drawing memory and a dynamic display memory. The drawing memory stores data and at least a portion of the data are possibly rewritten into a new data at a third timing, the third timing being optional between a first timing and a second timing. The dynamic display memory is connected with the drawing memory, which latches the data in response to the first timing and continues to hold the data between the first timing and the second timing. The drawing memory is partially disconnected from the dynamic display memory in the rewritten portion when the portion is rewritten in the drawing memory.

Here, the drawing memory may include a plurality of first memory cells arranged in a matrix, and the dynamic display memory may include a plurality of second memory cells arranged in a matrix; and a transfer transistor provided for each of the plurality of second memory cells. The plurality of transfer transistor are turned on to connect the plurality of first memory cells and the plurality of second memory cells at the first timing, respectively. When the portion of the data is rewritten at the third timing, the plurality of transfer transistors corresponding to the rewritten portion are turned off at the third timing.

Also, the dynamic display memory may further includes a transfer word line connected with gates of the plurality of transfer transistors in each of rows of the plurality of second memory cells. The display memory circuit may further include a transfer word control circuit which outputs an transfer signal in an active state onto all of the transfer word lines in response to the first timing such that the plurality of transfer transistors are turned on.

In this case, the rewrite may be carried out in unit of rows of the plurality of first memory cells. The transfer word control circuit sets the transfer signals corresponding to the rewritten portion to an inactive state in response to the third timing, such that each of the plurality of transfer transistors is turned off in response to the transfer signal in the inactive state.

Also, the transfer word control circuit may include a flip-flop circuit provided for each of the plurality of transfer word lines. The flip-flop circuit sets the transfer signal on the transfer word line to the active state in response to the first timing, and resets the transfer signal on the transfer word line to the inactive state in response to the third timing.

Also, each of the plurality of second memory cells may includes the transfer transistor; a memory capacitor connected with the transfer transistor to receive and hold a corresponding one of bits of the data; a drive transistor driven based on the bit stored in the memory capacitor; and a read transistor which is connected with the drive transistor and a read bit line to transfer the bit stored in the memory capacitor to the read bit line such that the held data is displayed on the display section.

In this case, each of the plurality of second memory cells may further include a buffer connected between the transfer transistor and a corresponding one of the plurality of first memory cells. In this case, it is desirable that the buffer is an inverter.

Also, each of the first timing and the second timing may be a start timing of a display frame.

In another aspect of the present invention, a display controller includes any of the above-mentioned display memory circuits; and a drawing circuit which receives the new data from an external unit and writes the new data in the drawing memory.

DESCRIPTION OF THE PREFERRED EMBODIMENTS

Hereinafter, a display controller with a display memory circuit of the present invention will be described below with reference to the attached drawings.

Figure 4:
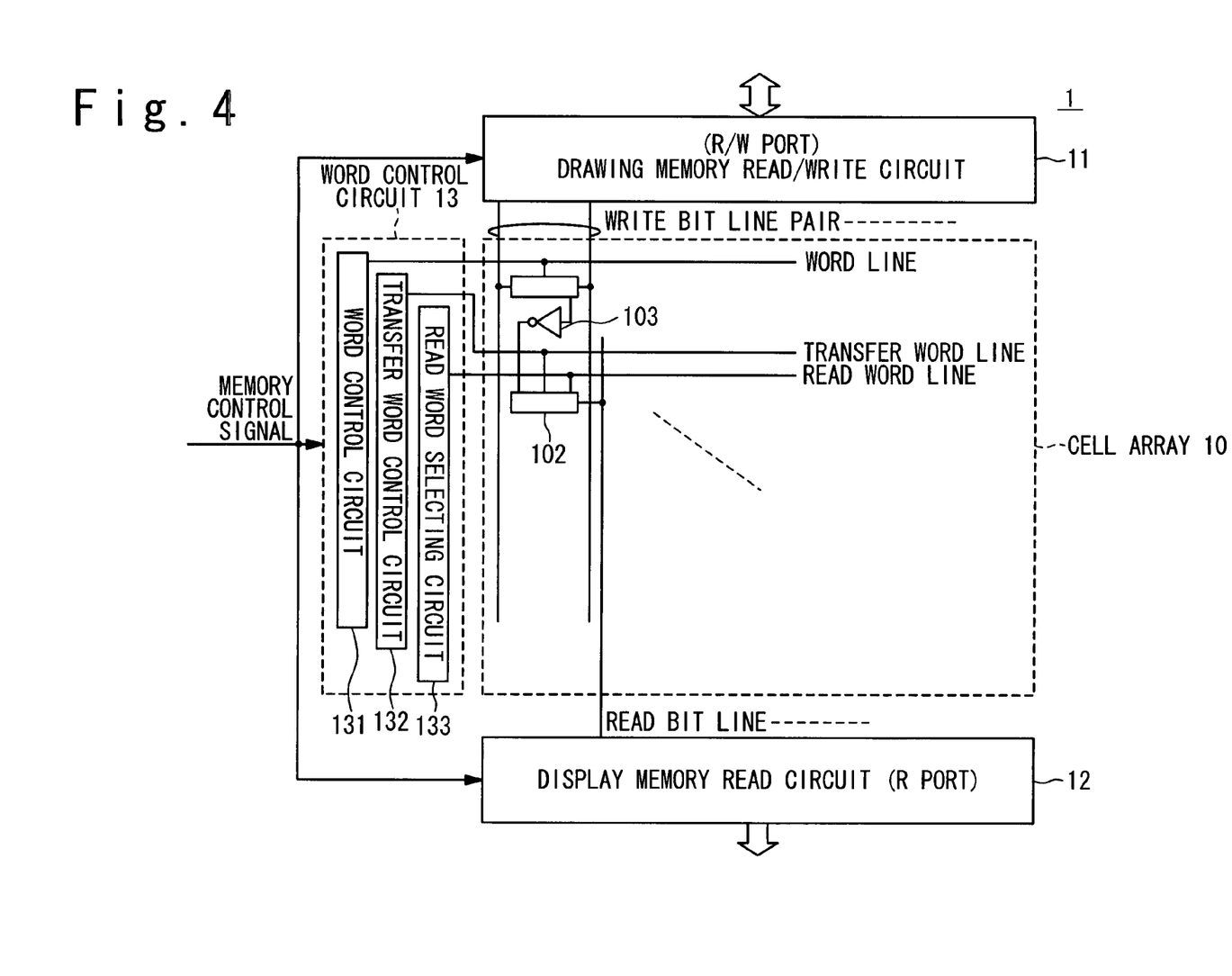
FIG. 4 is a block diagram showing a configuration of a display memory circuit according to an embodiment of the present invention.

FIG. 4 is a block diagram showing a configuration of a display memory circuit according to an embodiment of the present invention. The display memory circuit 1 in the embodiment includes a memory cell array 10, a drawing memory read/write circuit 11, a display memory read circuit 12 and a word control circuit 13.

In the cell array 10, a plurality of memory cell units are arranged in a matrix. Each of the memory cell units includes a memory cell 101 (FIG. 5) for the drawing memory, a memory cell 102 for a dynamic display memory, and a buffer 103 (inverter) for buffering data from the memory cell 101 and outputting it to the memory cell 102. The memory cell 101, the memory cell 102 and the buffer 103 are arranged adjacent to each other. It should be noted that only one memory cell unit is shown in FIG. 4. The memory cell 101 is connected to a word line and a pair of bit lines, and the memory cell 102 is connected to a transfer word line, a read word line and a read bit line. Data are transferred from the memory cells 101 to the memory cells 102 through the buffers 103 in a row of memory cell units in parallel in response to a row address.

The drawing memory read/write circuit 11 has a read/write port connected with a system bus. The read/write circuit 11 carries out a pre-charging control of the pairs of bit lines connected of columns of memory cells 101 in the cell array 10 in response to a memory control signal including an address signal. Also, in the data read mode of the drawing memory, the read/write circuit 11 senses and selects a read data signal on each pair of bit lines in the cell array 10, and drives the read/write port to output the read data signal from the read/write port. Also, in the data write mode of the drawing memory, the read/write circuit 11 selects and drives each pair of bit lines, and drives the read/write port to write a write data signal in the memory cell 101 through the read/write port.

The display memory read circuit 12 has a read port of exclusive use for a reading operation. In the data read mode of the dynamic display memory, the read circuit 12 senses and selects the read data signal on the each read bit line in the cell array 10, and drives the read port to output the read data signal.

The word control circuit 13 includes a word address decoder 131, a transfer word control circuit 132, and a read word selecting circuit 133. The word address decoder 131 decodes an address signal for the drawing memory included in the memory control signal, selects one of the word lines based on the decoded result, and outputs a word selection signal on the selected word line. The transfer word control circuit 132 selects at least one of transfer word lines for the display memory in response to a write control signal into the drawing memory included in the memory control signal and a synchronization signal of a display frame, and outputs a transfer signal on the selected transfer word line. The transfer word control circuit 132 is made inactive in response to a write control signal for the drawing memory and active in response to the synchronization signal of the display frame. The read word selecting circuit 133 carries out an address decoding operation or a scan-shift operation based on the address signal corresponding to scanning of the display frame and contained in the memory control signal or the synchronization signal, selects one of the read word lines for the memory cells 102 in the dynamic display memory, and outputs a read signal on the selected read word line.

As described above, the display memory circuit shown in FIG. 1 includes the drawing memory and the dynamic display memory. The drawing memory is composed of the memory cells 101 in the cell array 10, the drawing memory read/write circuit 11, and the word address decoder 131 of the word control circuit 13. The drawing memory is accessed from an external unit and stores drawing data. Also, the dynamic display memory is composed of the memory cells 102 and the buffers 103 in the cell array 10, the display memory read circuit 12, and the transfer word control circuit 132 and the read word selecting circuit 133 of the word control circuit 13. The memory cells 101 of the drawing memory stores the drawing data and the whole of stored drawing data can be read out in parallel from the memory cells 101 in response to a write operation into the drawing memory. The dynamic display memory receives and holds the drawing data outputted from the drawing memory through the buffers 103 in response to the transfer signal on each transfer word line. Thus, the dynamic display memory can hold the drawing data before the writing operation into the drawing memory. The dynamic display memory outputs the held data onto the read bit lines as display data in synchronism with the display frame in response to the read signal on the read word line.

Figure 5:
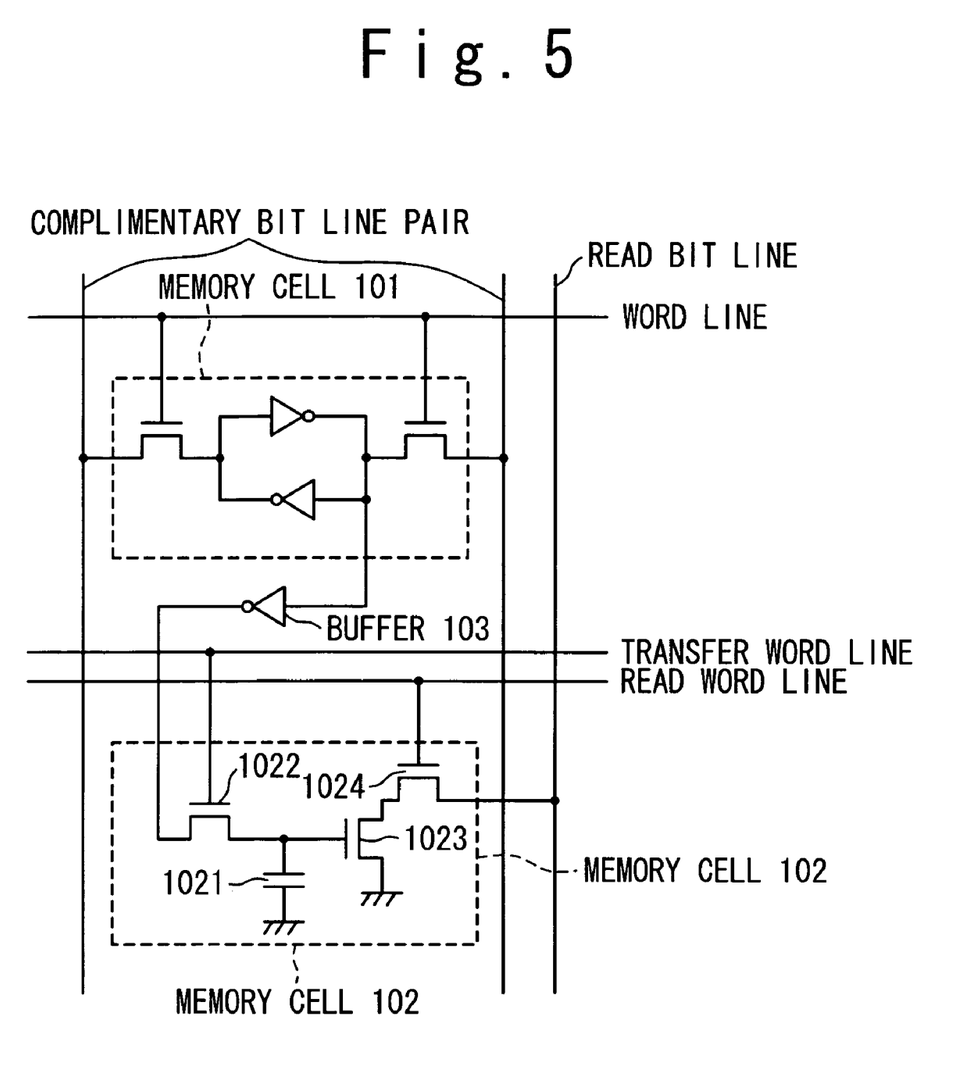
FIG. 5 is a circuit diagram showing one memory cell unit in a cell array shown in FIG. 4.

FIG. 5 is a circuit diagram showing one memory cell unit in the cell array 10 shown in FIG. 4. The memory cell unit includes the memory cell 101 for the drawing memory, the memory cell 102 for the dynamic display memory and the buffer 103.

The memory cell 101 is a static RAM cell composed of a latch and two MOS transistors in the embodiment of the present invention. The memory cell 101 is connected with a pair of complementary bit lines and the word line, and is accessed from the drawing memory read/write circuit 11. It should be noted that the explanation of the configuration of the memory cell 101 is omitted because it is widely known.

The memory cell 102 is composed of a dynamic RAM cell in the embodiment of the present invention and includes a memory capacitor 1021 for storing a data bit, a transfer transistor 1022, a drive transistor 1023, and a read transistor 1024. The transfer transistor 1022 is arranged between the memory capacitor 1021 and the buffer 103, and has a gate connected with the transfer word line. The drive transistor 1023 has a gate connected with the memory capacitor 1121 and a source connected with the ground. The read transistor 1024 is arranged between a drain of the drive transistor 1023 and the read bit line and has a gate connected with the read word line.

The buffer 103 is composed of an inverter and arranged between the memory cell 101 and the memory cell 102, in the embodiment of the present invention. The buffer 103 buffers the storage data in the memory cell 101 for the drawing memory to output to the memory cell 102 for the dynamic display memory. The buffer 103 may be included in either the memory cell 101 or the memory cell 102.

Figure 6:
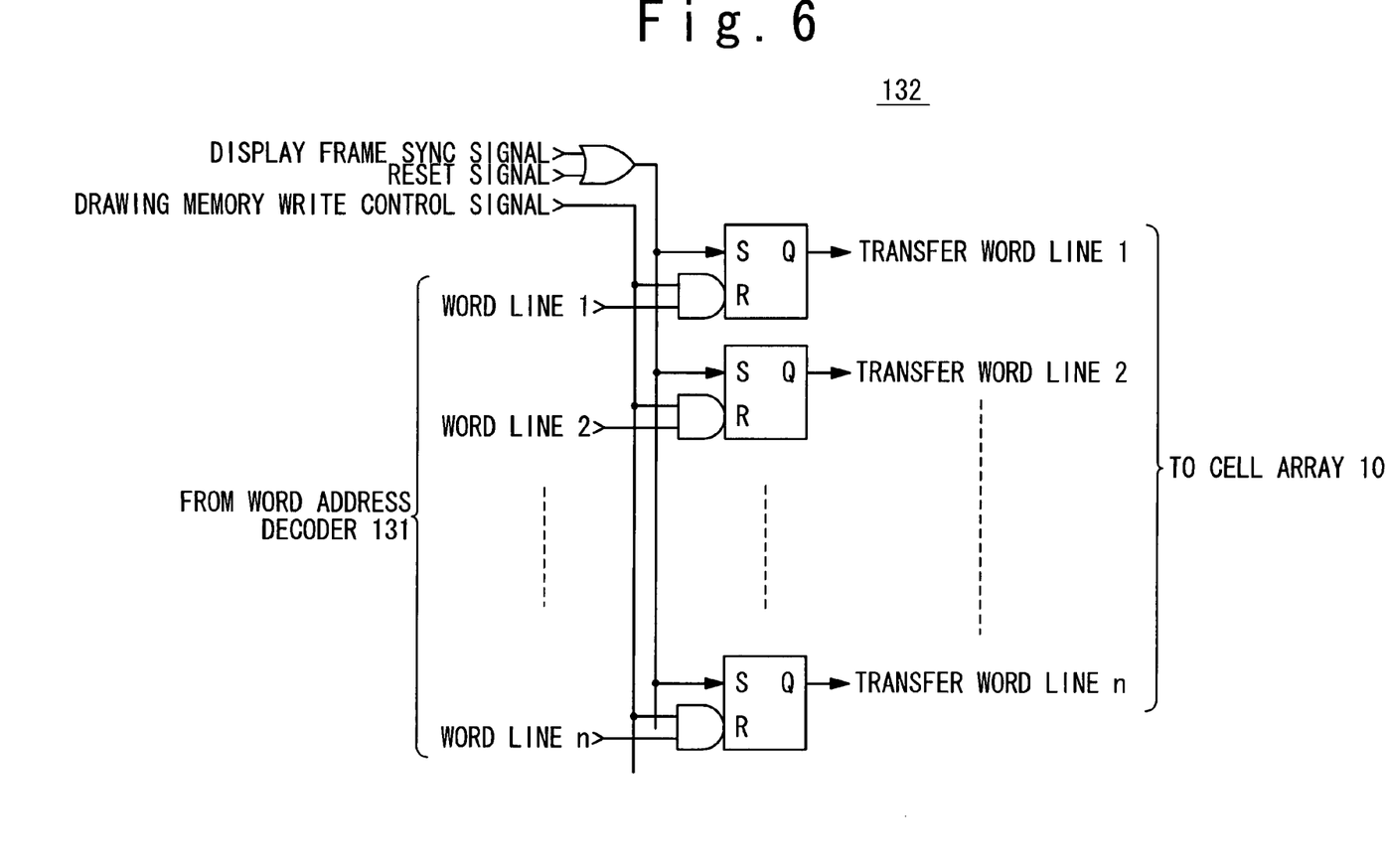
FIG. 6 is a block diagram showing a transfer word control circuit of the display memory circuit shown in FIG. 4.

FIG. 6 is a block diagram showing an example of the transfer word control circuit 132 of the display memory circuit shown in FIG. 4. The transfer word control circuit 132 includes a flip-flop for every word address in the embodiment of the present invention. The flip-flop drives a corresponding one of the transfer word lines of the dynamic display memory. As described above, the word address decoder 131 decodes the word address, selects one of the word lines based on the decoded result, and output a word address signal on the selected word line. Each flip-flop is reset in response to a logical product of the word selection signal on the word line supplied from the word address decoder 131 and the write control signal into the drawing memory included in the memory control signal, and is set in response to the synchronization signal of the display frame included in the memory control signal or a reset signal. The reset signal is a general reset signal and does not relate to the present invention.

Figure 7A:
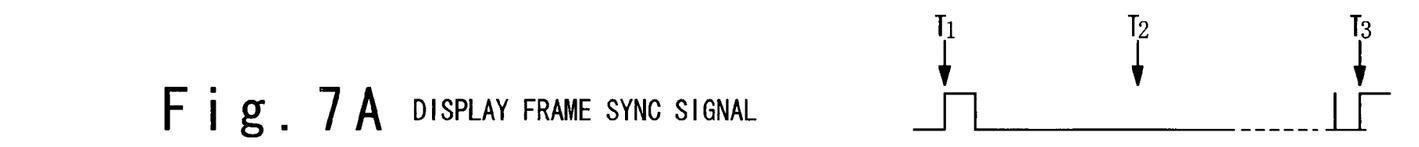
FIGS. 7A to 7F are timing charts showing an operation of the memory cell units of the cell array and the transfer word control circuits shown in FIG. 4.
Figures 7B, 7C:
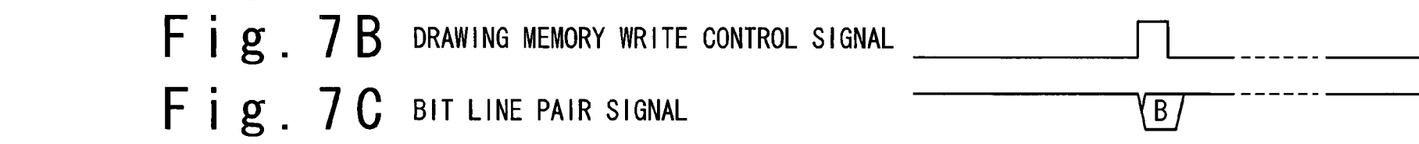
Figure 7D:
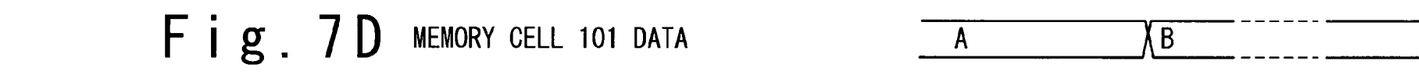

FIGS. 7A to 7F are timing charts showing an example of operation of the memory cell units of the cell array 10 and the transfer word control circuits 132 shown in FIGS. 4 to 6. It is supposed that the memory cells 101 of the drawing memory store data A as shown in FIG. 7D.

Figure 7E:
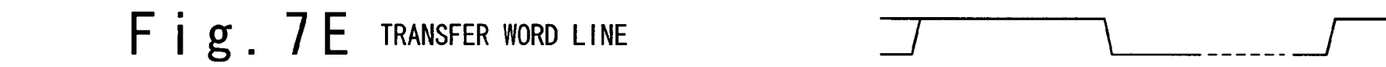
Figure 7F:
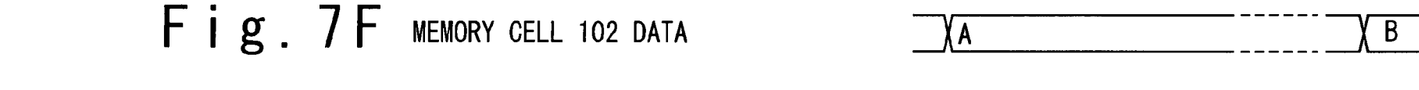

First of all, at timing T1, the synchronization signal of the display frame in the memory control signal is set to an active level as shown in FIG. 7A. The synchronization signal indicates a start timing of the display frame. As a result, the transfer signals of all the transfer word lines are set to an active level, and are outputted on the transfer word lines as shown in FIG. 7E. Therefore, the data A stored in all the memory cells 101 of the drawing memory are transferred to the memory cells 102 of the dynamic display memory through the buffer 103 and the transfer transistors 1022 and stored in the memory cells 102 of the dynamic display memory, as shown in FIG. 7F. In response to the scanning of lines of the display frame, the read signal is sequentially outputted to the read word lines. As a result, the read transistor 1024 in each of the memory cells 102 of the scanning line is turned on and the data A is read out onto the read bit line. Thus, the data A is displayed on the display section. It should be noted that at this time the pairs of bit lines of the drawing memory are precharged.

Next, an operation at timing T2 will be described. The timing T2 is an optional timing between the synchronization signals of the display frame. Here, at the timing T2, it is supposed that the write control signal into the drawing memory is set to an active level as shown in FIG. 7B, and the data B are outputted on the pairs of bit lines as shown in FIG. 7C, such that data B is written in the memory cells 101 of a row. In this case, the bit lines of the pairs for the memory cells 101 for the drawing memory are set to levels corresponding to the data B by the drawing memory read/write circuit 11. Also, the word address decoder 131 decodes the word address, select one of the word lines corresponding to the above row based on the decoded result, and output the word selection signal onto the selected word line. Thus, the data B can be written in the memory cells 101 of the row. As a result, the memory cells 101 of the drawing memory other than the memory cells 101 corresponding to the word address stores the data A and the memory cells 101 corresponding to the word address stores the data B.

In this case, in the flip-flop corresponding to the selected word line, the flip-flop is reset in response to the logical product of the write control signal shown in FIG. 7B and the word selection signal on the selected word line. As a result, the transfer signal on the transfer word line corresponding to the selected word line is set to an inactive level as shown in FIG. 7E. Therefore, all the memory cells 102 continues to hold the data A, as shown in FIG. 4F. Therefore, the data A can be displayed on the display section A, while the data B is written in a portion of the memory cells 101 of the drawing memory. Also, the memory cells 101 can be rewritten or updated during the data display.

Next, at timing T3, when the synchronization signal of the display frame is set to the active level again as shown in FIG. 7A, the transfer signals on all the transfer word line are set to the active level as shown in FIG. 7E, and the memory cells 101 of the drawing memory output the data B and the memory cells 102 of the dynamic display memory receive and store the data B through the buffers 103 as shown in FIG. 7F. The data B stored in the memory cells 102 are transferred to the display section through the drive transistor 1023, the read transistor 1024 and the read bit lines, so that the data B is displayed on the display section. Thus, the writing operation of the data B into the memory cells 101 of the drawing memory between the synchronization signals T1 and T3 is reflected on the display. In this way, the data stored in the memory cells 102 of the dynamic display memory are changed in response to not the write control signal of the drawing memory but the synchronization signal of the display frame. The stored data is read out in response to the read signal on the read word line in synchronism with the scanning of the display frame, sensed by the dynamic display memory read circuit 12 and outputted as the display data from the read port, as in the conventional technique. Thus, it is possible to correspond to a video image display. As shown in FIGS. 7A to 7F, in the display memory circuit in the embodiment of the present invention, the memory cells of the dynamic display memory continues to hold data for a period from the write control signal into the drawing memory to the synchronization signal of the display frame. The longest time of the hold period is a period of the display frame, which is shorter than the hold period of a dynamic RAM cell used generally. As a result, a refreshing operation is not necessary for the dynamic display memory.

Also, the data are read out from all the memory cells 101 in parallel. The data may be stored in the memory cells 102 collectively or in unit of rows.

Moreover, even if the drawing memory scale is increased for multi-function, the dynamic display memory can be used in which the dynamic RAM cells unnecessary for the refreshing operation are arranged in matrix. Further, control of data transfer from the drawing memory to the dynamic display memory is easy, and the control is achieved by a minimum circuit scale. Thus, the increase of a chip area for the display memory circuit can be restrained.

Also, in case of display of a video image, only the transfer word line corresponding to the write word address into the drawing memory is set to the inactive level in the dynamic display memory. The other transfer word lines are not changed and kept in the active level. Thus, it is sufficient that the data transfer between the drawing memory and the dynamic display memory is carried out in a portion of the drawing memory corresponding to the write word address. Thus, the display of the video image can be carried out in low power consumption.

Further, in case of display of a still image, all the transfer word lines of the dynamic display memory are not changed but kept to the active level because the writing operation to the drawing memory is not carried out. Each memory cell 102 of the dynamic display memory only outputs the data transferred from the memory cell 101 of the drawing memory. Thus, a refreshing operation is not needed, and the display of the still image is carried out in the lowest power consumption.

Additionally, in the display memory circuit of the present invention, it is not necessary to set a non-display period within the display frame period for transfer data between the drawing memory and the dynamic display memory, unlike the conventional display system shown in FIG. 3. Also, the transfer control process by a calculation circuit or CPU is not needed. Thus, the processing can be carried out at high speed, and can be carried out in low power consumption in case of constant processing speed.

It should be noted that the display memory circuit in the embodiment is described assuming that the memory cell of the drawing memory is composed of the static RAM cell. However, it is not limited to this configuration. The display memory circuit may be composed of a dynamic drawing memory, in which dynamic RAM cells are arranged in an array, and a dynamic display memory. In this case, data are transferred from all the memory cells of the dynamic drawing memory in parallel. The dynamic display memory holds the transfer data in synchronism with a refreshing operation or access to the dynamic drawing memory. Then, the dynamic display memory outputs the held data as a display data from the read port in synchronism with a scanning of the display frame in response to the read signal on the read word lime. As a result, it is possible to correspond to a destructive readout of the dynamic RAM cell, and the chip area for the cell array is reduced further.

Moreover, in the display memory circuit of the embodiment, the drawing memory has the read/write (R/W) port. However, it is not limited to the read/write port, and the drawing memory may have a write port for write exclusive use.

Figure 8:
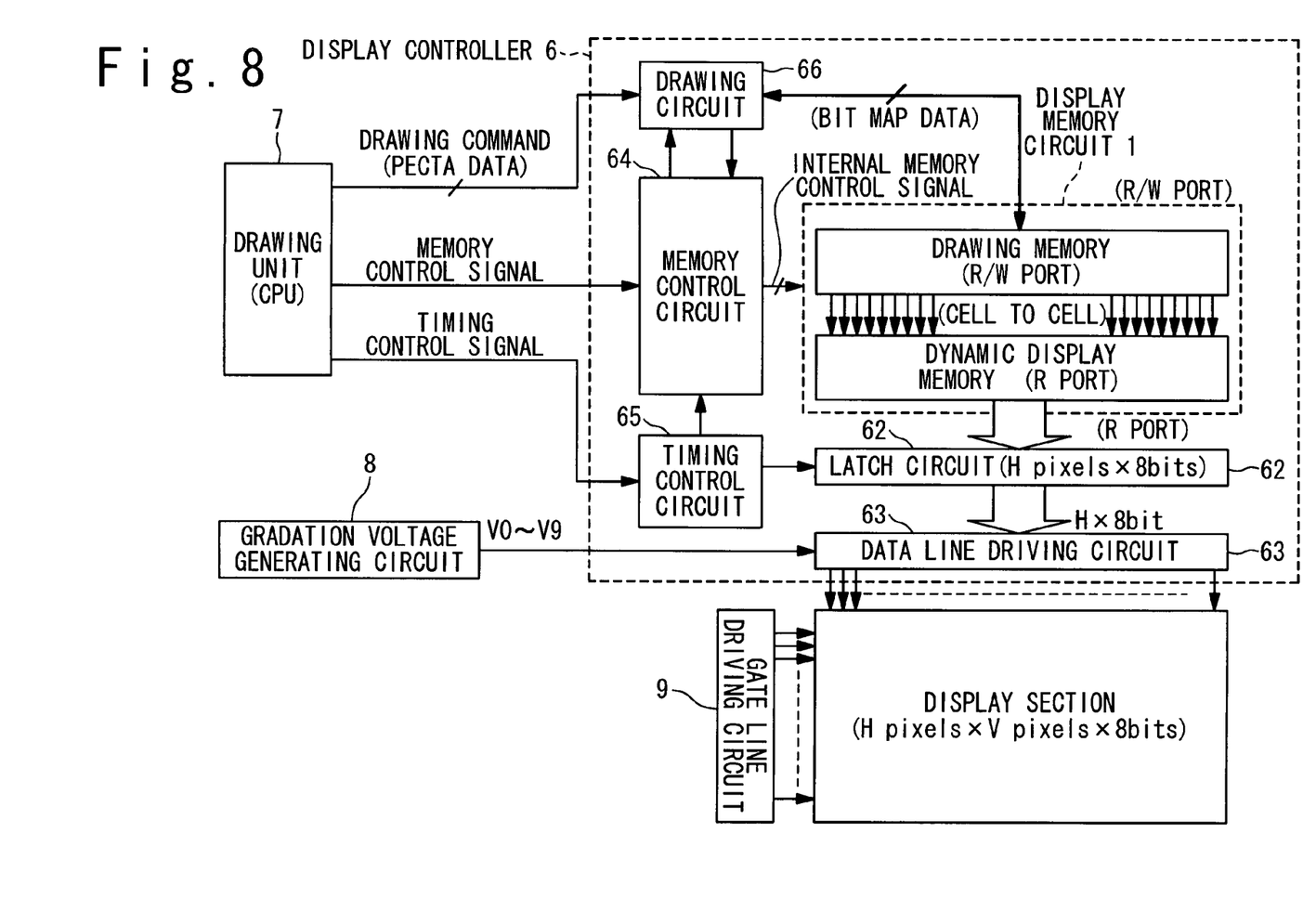
FIG. 8 is a block diagram showing a configuration of a display controller of the present invention to which the above-mentioned display memory circuit is applied.

FIG. 8 is a block diagram showing a configuration of a display controller of the present invention to which the above-mentioned display memory circuit is applied. Referring to FIG. 8, the display controller 6 in the embodiment corresponds to the conventional display controller 106 shown in FIG. 1. The display controller 6 in the embodiment includes the display memory circuit 1 shown in FIG. 4, a latch circuit 62, a data line drive circuit 63, a memory control circuit 64, a timing control circuit 65, and a drawing circuit 66. Compared with the conventional display controller 106 shown in FIG. 1, the latch circuit 62, the data line drive circuit 63, and the timing control circuit 65 have the same functions as those of the conventional display controller 106. The drawing memory and the drawing circuit 66 for the display memory circuit 1 are added in the embodiment, and the display memory 161 in the conventional display controller 106 is replaced by the dynamic display memory of display memory circuit 1 in the embodiment. The memory control circuit 64 further contains the function to control the drawing memory of the display memory circuit 1.

The drawing memory of the display memory circuit 1 stores the drawing data transferred from the drawing circuit 66 in response to the memory control signal from the memory control circuit 64. The drawing data are transferred from all the memory cells of the drawing memory in parallel. The dynamic display memory of the display memory circuit 1 continues to hold the drawing data transferred from the drawing memory before the writing operation into the drawing memory. The held data are outputted as a display data from the read port in synchronism with scanning of the display frame in response to the read signal on the read word line.

The drawing circuit 66 carries out processes peculiar to a display section accompanied by high precision of a display panel and multi-function of reproduction of a video image to the drawing data supplied from a drawing unit 7, and stores in the drawing memory of display memory circuit 1.

In this way, the display controller 6 and the drawing unit 7 can carry out a distributed processing. Thus, a load on the frame processing in the drawing unit 7 is reduced. As a result, the entire processing system which processes a large amount of data in units of frames, is sped up further.

Also, for instance, when the drawing circuit 66 can convert image data from vector data into bit map data, it is possible to transmit the image data of the vector data from the drawing unit 7 to the display controller 6. In this case, an amount of data to be transferred decreases remarkably, and the data transfer between the drawing unit 7 and the display controller 6 is carried out in low power consumption and low EMI.

As described above, according to the display memory circuit of the present invention, the refreshing operation of the dynamic display memory is not needed. Also, a dynamic RAM memory, in which dynamic RAM cells unnecessary to refresh are arranged, can be used as the display memory even in case that it is necessary to increase the memory capacity of the drawing memory. Moreover, the data transfer control from the drawing memory to the display memory is easy, and accomplished by the minimum circuit configuration. As a result, the increase of the chip area of the display memory circuit can be restrained.

What is claimed is:

1. A display memory circuit comprising:
   a drawing memory which stores data and in which at least a portion of said data is rewritten into new data at a third timing, said third timing being between a first timing and a second timing that are each a start timing of a display frame; and
   a dynamic display memory which is connected with said drawing memory, which latches said data in response to said first timing and continues to hold said data between said first timing and said second timing,
   wherein said drawing memory is partially disconnected from said dynamic display memory from said third timing to said second timing;
   said drawing memory comprising a plurality of first memory cells arranged in a matrix;
   said dynamic display memory comprising:
   a plurality of second memory cells arranged in a matrix, and a transfer transistor provided for each of said plurality of second memory cells, said plurality of transfer transistors being turned on to connect said plurality of first memory cells and said plurality of second memory cells at said first timing, respectively, and when said portion of said data is rewritten at said third timing, said plurality of transfer transistors corresponding to the rewritten portion being turned off at said third timing;
   each of said plurality of second memory cells comprising:
   said transfer transistor;
   a memory capacitor connected with said transfer transistor to receive and hold a corresponding one of bits of said data;
   a drive transistor driven based on the bit stored in said memory capacitor; and
   a read transistor which is connected with said drive transistor and a read bit line to transfer the bit stored in said memory capacitor to said read bit line such that said held data is displayed on said display section,
   wherein each of said plurality of second memory cells further comprises a buffer connected between said transfer transistor and a corresponding one of said plurality of first memory cells, and wherein said data is transferred via said buffer without using said read bit line.

2. The display memory circuit according to claim 1, wherein said dynamic display memory further comprises:
a transfer word line connected with gates of said plurality of transfer transistors in each of rows of said plurality of second memory cells, and
said display memory circuit further comprises a transfer word control circuit which outputs a transfer signal in an active state onto all of said transfer word lines in response to said first timing such that said plurality of transfer transistors are turned on.

3. The display memory circuit according to claim 2, wherein the rewrite is carried out in unit of rows of said plurality of first memory cells, and
said transfer word control circuit sets said transfer signals corresponding to the rewritten portion to an inactive state in response to said third timing, such that each of said plurality of transfer transistors is turned off in response to said transfer signal in the inactive state.

4. The display memory circuit according to claim 3, wherein said transfer word control circuit comprises a flip-flop circuit provided for each of said plurality of transfer word lines, and
said flip-flop circuit sets said transfer signal on said transfer word line to the active state in response to said first timing, and resets said transfer signal on said transfer word line to the inactive state in response to said third timing.

5. The display memory circuit according to claim 1, wherein said buffer is an inverter.

6. The display memory circuit according to claim 1, wherein each of said first timing and said second timing is a start timing of a display frame.

7. A display controller comprising:
a display memory circuit which comprises:
a drawing memory which stores data and in which at least a portion of said data is rewritten into new data at a third timing, said third timing being between a first timing and a second timing that are each a start timing of a display frame; and
a dynamic display memory which is connected with said drawing memory, which latches said data in response to said first timing and continues to hold said data between said first timing and said second timing; and
a drawing circuit which receives said new data from an external unit and writes said new data in said drawing memory at said third timing,
wherein said drawing memory is partially disconnected from said dynamic display memory from said third timing to said second timing;
said drawing memory comprising a plurality of first memory cells arranged in a matrix;
said dynamic display memory comprising:
a plurality of second memory cells arranged in a matrix, and a transfer transistor provided for each of said plurality of second memory cells, said plurality of transfer transistors being turned on to connect said plurality of first memory cells and said plurality of second memory cells at said first timing, respectively, and when said portion of said data is rewritten at said third timing, said plurality of transfer transistors corresponding to the rewritten portion are turned off at said third timing;
each of said plurality of second memory cells comprising;
said transfer transistor;
a memory capacitor connected with said transfer transistor to receive and hold a corresponding one of bits of said data;
a drive transistor driven based on the bit stored in said memory capacitor; and
a read transistor which is connected with said drive transistor and a read bit line to transfer the bit stored in said memory capacitor to said read bit line such that said held data is displayed on said display section,
each of said plurality of second memory cells further comprises a buffer connected between said transfer transistor and a corresponding one of said plurality of first memory cells, wherein said data is transferred via said buffer without using said read bit line.

8. The display controller according to claim 7, wherein said dynamic display memory further comprises:
a transfer word line connected with gates of said plurality of transfer transistors in each of rows of said plurality of second memory cells, and
said display memory circuit further comprises a transfer word control circuit which outputs a transfer signal in an active state onto all of said transfer word lines in response to said first timing such that said plurality of transfer transistors are turned on.

9. The display controller according to claim 8, wherein the rewrite is carried out in unit of rows of said plurality of first memory cells, and
said transfer word control circuit sets said transfer signals corresponding to the rewritten portion to an inactive state in response to said third timing, such that each of said plurality of transfer transistors is turned off in response to said transfer signal in the inactive state.

10. The display controller according to claim 9, wherein said transfer word control circuit comprises a flip-flop circuit provided for each of said plurality of transfer word lines, and
said flip-flop circuit sets said transfer signal on said transfer word line to the active state in response to said first timing, and resets said transfer signal on said transfer word line to the inactive state in response to said third timing.

11. The display controller according to claim 7, wherein said buffer is an inverter.

12. The display controller according to claim 7, wherein each of said first timing and said second timing is a start timing of a display frame.

13. A display memory circuit comprising: a drawing memory which comprises a plurality of first memory cells arranged in a matrix;
a dynamic display memory which comprises a plurality of second memory cells arranged in a matrix, each of said plurality of first memory cells being connected with a corresponding one of said plurality of second memory cells;
a pair of bit lines connected with each of columns of said first memory cells;
a word line connected with each of rows of said first memory cells;
a transfer word line connected with each of rows of said second memory cells;
a read word line connected with each of the rows of said second memory cells;
a read bit line connected with each of columns of said second memory cells; and
a buffer interposed between each of said plurality of first memory cells and the corresponding one of said plurality of second memory cells, wherein a transfer signal on each of said plurality of transfer word lines is set to an active state when data stored in said drawing memory is transferred to said dynamic display memory, said data being transferred via said buffer without using said pair of bit lines, and when at least a portion of data stored in said drawing memory is rewritten during a display frame, said transfer signals corresponding to said rewritten portion are set to an inactive state such that said second memory cells corresponding to said rewritten portion are partially disconnected from said drawing memory until a start timing of a next display frame.

* * * * *